United States Patent [19]

Kamei et al.

[11] 4,157,610

[45] Jun. 12, 1979

[54] METHOD OF MANUFACTURING A FIELD EFFECT TRANSISTOR

[75] Inventors: Kiyoo Kamei, Yokohama; Toshiaki Ikoma, Tokyo; Hirokuni Tokuda, Kawasaki, all of Japan

[73] Assignee: Tokyo Shibaura Electric Co., Ltd., Kawasaki, Japan

[21] Appl. No.: 825,720

[22] Filed: Aug. 18, 1977

[30] Foreign Application Priority Data

Dec. 20, 1976 [JP] Japan .................................. 51-151941
Dec. 20, 1976 [JP] Japan .................................. 51-151942
Dec. 20, 1976 [JP] Japan .................................. 51-151943
Dec. 20, 1976 [JP] Japan .................................. 51-151944

[51] Int. Cl.$^2$ ............................................. B01J 17/00
[52] U.S. Cl. ......................................... 29/571; 29/578; 204/15; 204/56 R

[58] Field of Search ................... 29/571, 578; 204/15, 204/56 R

[56] References Cited

U.S. PATENT DOCUMENTS

| 3,345,274 | 10/1967 | Schmidt | 204/56 R |
| 3,775,262 | 11/1973 | Heyerdahl | 204/15 |
| 3,929,589 | 12/1975 | Ermanis | 204/56 R |

OTHER PUBLICATIONS

"Semiconductors", by Goudet & Meuleau, 1957, p. 86.

*Primary Examiner*—W. Tupman
*Attorney, Agent, or Firm*—Oblon, Fisher, Spivak, McClelland & Maier

[57] ABSTRACT

The exposed surface of a semi-insulating compound semiconductor substrate is anodized while light is irradiated to the exposed surface to form a gate insulating film on the substrate between source and drain regions.

6 Claims, 15 Drawing Figures

F I G. 1A 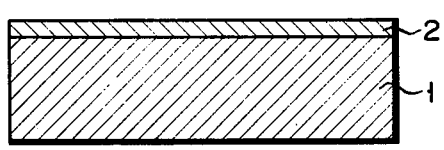
F I G. 2A 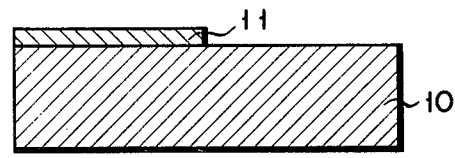
F I G. 1B 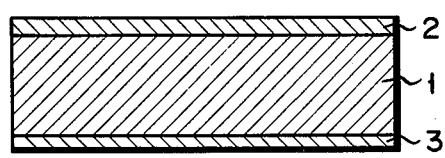
F I G. 2B 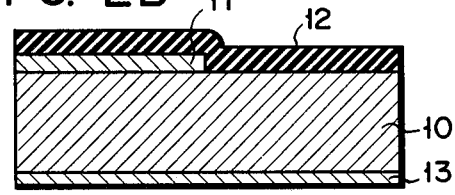
F I G. 1C 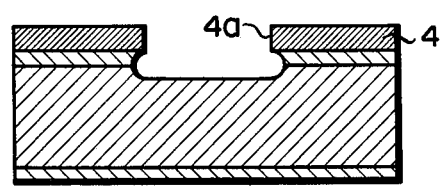
F I G. 2C 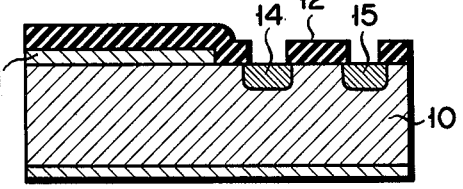
F I G. 1D 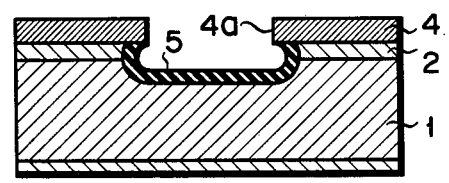
F I G. 2D 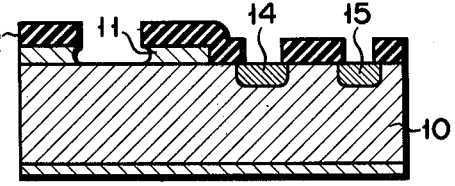
F I G. 1E 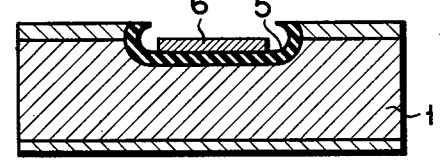
F I G. 2E 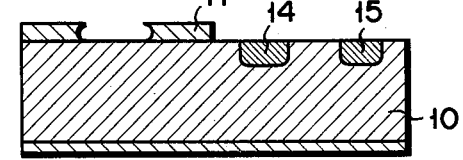
F I G. 1F 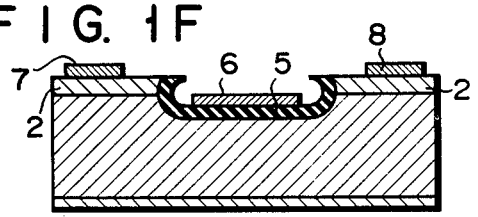
F I G. 2F 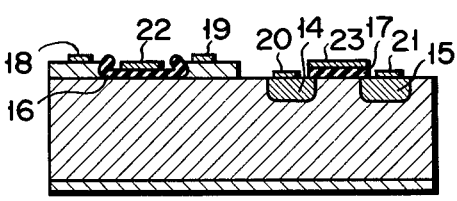

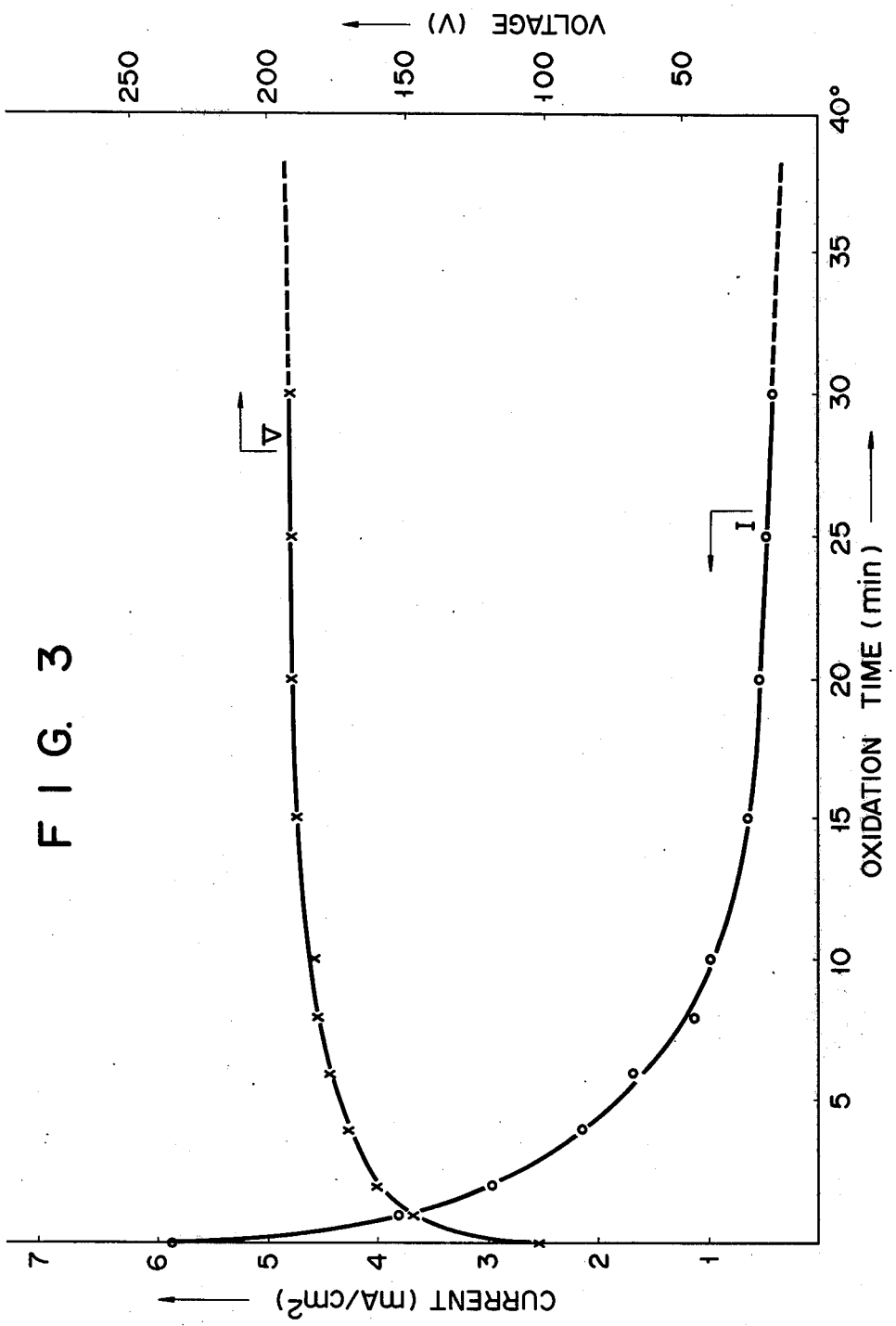

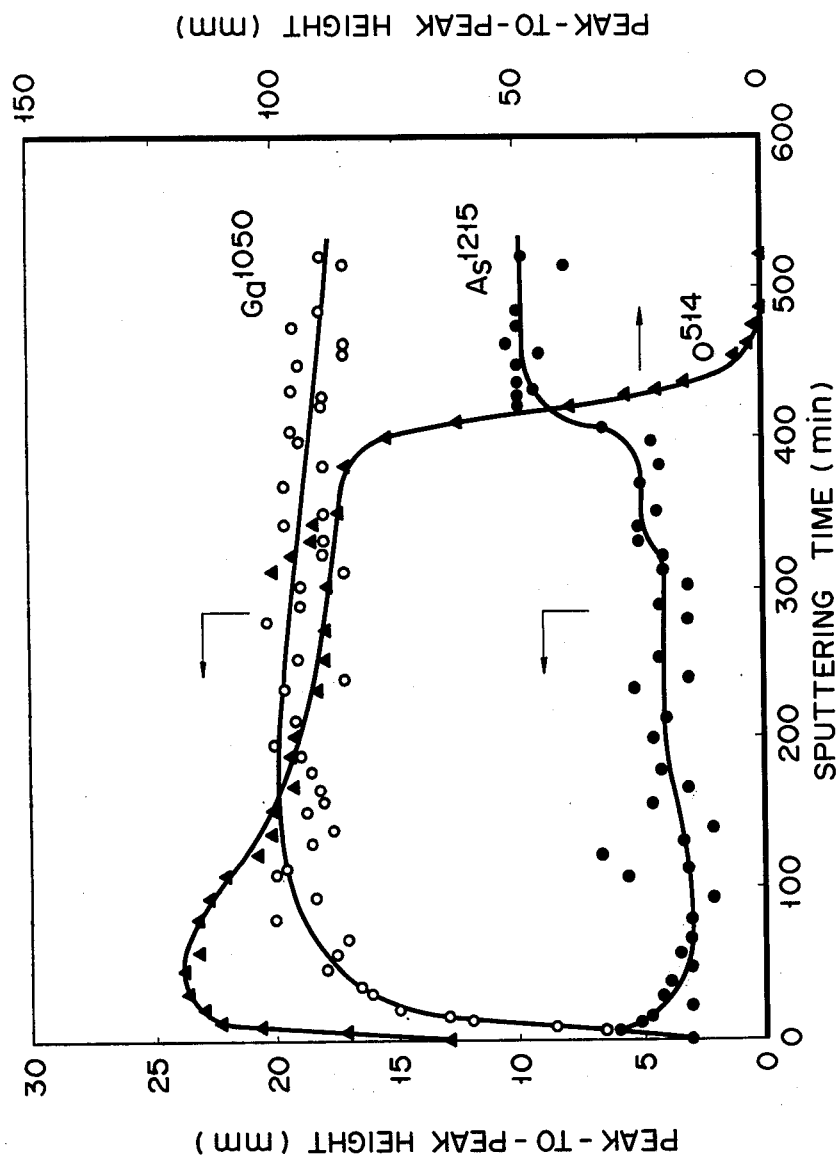

METHOD OF MANUFACTURING A FIELD EFFECT TRANSISTOR

BACKGROUND OF THE INVENTION

This invention relates to a method of producing an insulated gate field effect transistor by using a semiconductor substrate exhibiting a semi-insulating property.

A typical method of producing a conventional insulated gate field effect transistor comprises diffusing impurities into a p- or n-type conductive substrate to form source and drain regions, and forming a gate oxide film on the substrate surface between the source and drain regions. However, the use of such a conductive substrate brings about a large floating capacitance of the produced transistor, resulting in lowering of high frequency and high speed characteristics.

SUMMARY OF THE INVENTION

An object of this invention is to provide a method of easily producing an insulated gate field effect transistor smaller in floating capacitance.

According to this invention, an insulation film is directly formed on a semi-insulating substrate of a compound semiconductor such as GaAs and GaP, thereby reducing the floating capacitance of the produced transistor. It is very difficult to form an oxide film (insulation film) directly on a semi-insulating substrate without forming degenerated layer at the boundary between the substrate and the oxide film. In the case of using a conductive substrate, it is known to the art that a degenerated layer is not formed at the boundary between the substrate and an insulation film if the insulation film is formed by oxidizing the surface region of the substrate by an ordinary anodizing method. However, it was impossible to form an insulation film by an ordinary anodizing method in the case of using a semi-insulating material as the substrate, because the semi-insulating substrate fails to sufficiently supply holes on which the anodization relies.

In this invention, an insulation film equivalent to the film formed by an ordinary anodizing method may be formed on the surface of a semi-insulating substrate of compound semiconductor by anodization, which is carried out while light is being irradiated to that surface of the substrate which is to be oxidized. The anodization utilizing the light irradiation permits forming an insulation film without producing a degenerated layer at the boundary between the substrate and the insulation film. In addition, it has been found that the resultant insulation film exhibits various properties very suitable for the gate insulation film of a field effect transistor.

The "semi-insulating substrate" used herein denotes that, where the substrate is formed of, for example, GaAs, the impurity concentration of the substrate falls within the range of between $1 \times 10^8$ atoms cm$^{-3}$ and $1 \times 10^{13}$ atoms cm$^{-3}$. If the concentration is higher than the upper limit of the above-noted range, an anodization film may be formed without utilizing the light irradiation. But, in this case, the floating capacitance of the resultant transistor is increased. On the other hand, the use of an insulating substrate renders it difficult to induce a channel, resulting in that the produced transistor fails to perform its proper function.

BRIEF DESCRIPTION OF THE DRAWING

FIGS. 1A to 1F are cross sectional views showing the respective steps of a method producing an MOS field effect transistor according to one embodiment of this invention;

FIGS. 2A to 2F are cross-sectional views showing the steps of a method producing complementary field effect transistors according to another embodiment of this invention;

FIG. 3 is a graph showing the changes in current and voltage relative to the oxidation time in the anodizing step used in the method according to one embodiment of this invention;

FIG. 4A shows the distribution of atoms at the boundary region between an anode oxidation film and a semi-insulating GaAs substrate, obtained by Auger analysis.

DETAILED DESCRIPTION OF THE PREFERRED EMBODIMENTS

Figure 4B:
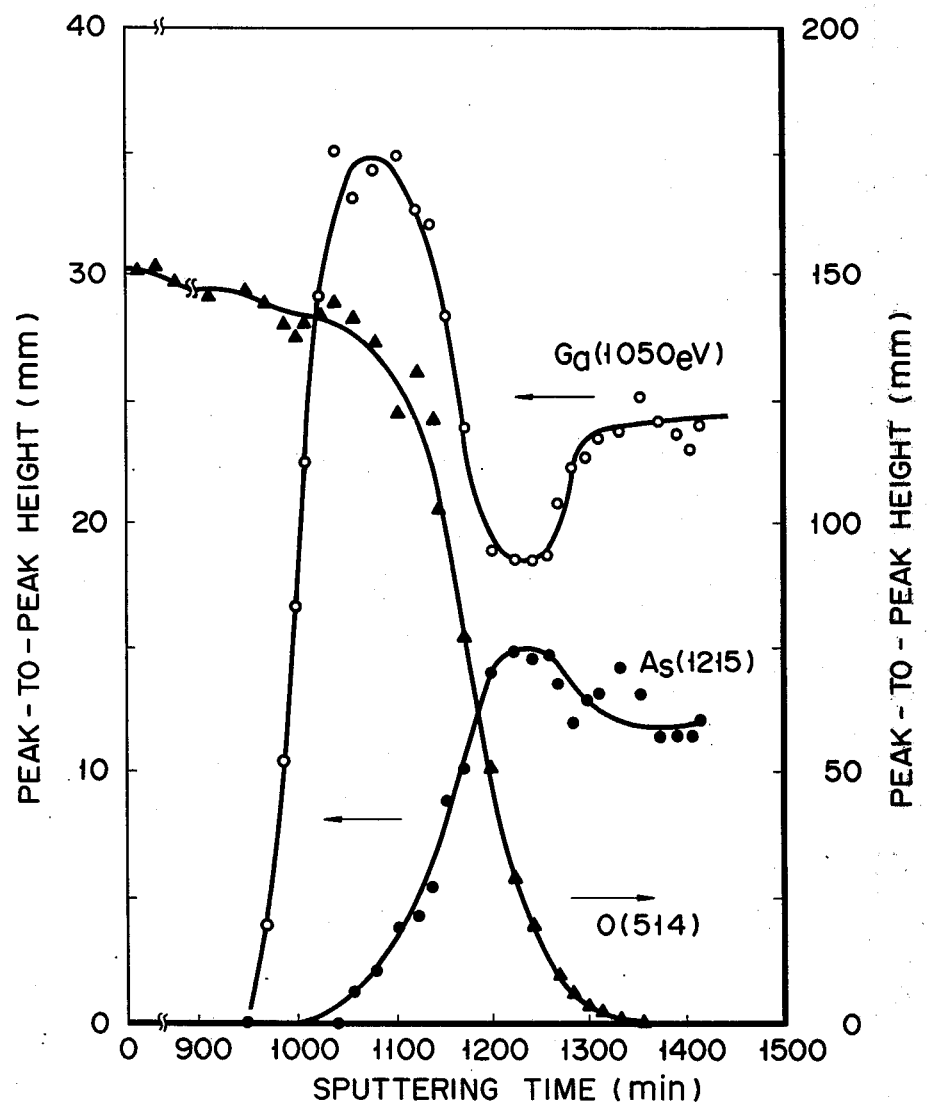
FIG. 4B shows the distribution of atoms obtained by Auger analysis at the boundary region between a thermal oxidation film, which was prepared for comparison with an anodization film, and a semi-insulating GaAs substrate.

FIGS. 1A to 1F show the steps of producing an MOS-FET according to one embodiment of this invention. As shown in FIG. 1A, an n$^+$ type GaAs layer 2 having a thickness of 0.5$\mu$ and an impurity concentration of about $1 \times 10^{18}$ atoms cm$^{-3}$ is formed by vapor growth epitaxial method on one surface of a semi-insulating GaAs substrate 1 doped with Cr and having a resistivity of $10^8$ $\Omega \cdot$cm and an impurity concentration of about $1 \times 10^8$ atoms cm$^{-3}$. It is preferred to use Sn as the impurity, but other impurities such as Te and Se may also be used, with satisfactory results.

Then, In and Sn are successively deposited by vapor deposition on the other surface of the substrate 1, followed by heating at a predetermined temperature, thereby preparing an ohmic electrode 3 made of an alloy of these metals as shown in FIG. 1B. After forming the electrode 3, a photo resist layer 4 is formed over the n$^+$ layer 2, followed by making an opening 4a using a predetermined patterning and subsequent etching of the n$^+$ layer 2 beneath the opening 4a with a GaAs etching solution, as shown in FIG. 1C. The Figure shows that the surface region of the substrate 1 has also been slightly removed by the etching, but, the surface region of the substrate need not be removed if it is possible to expose perfectly the substrate surface just beneath the opening 4a.

An anodization film or insulation film 5 having a suitable thickness is then formed at the exposed portion of the substrate 1 as shown in FIG. 1D, utilizing light irradiation. Described in the following is an example of forming the insulation film 5. Namely, the electrode 3 formed on the other surface of the substrate 1 is connected to an anode electrode to enable the substrate 1 to act as an anode, and 200 V of DC voltage is applied between the anode electrode and a cathode electrode formed of a platinum plate. In this case, it is preferred to use as the electrolyte a mixture of a 3% aqueous solution of tartaric acid and propylene glycol having a volume ratio of 1:3. Further, ammonia water is dripped to the mixture to adjust the pH value to about 7.0. In order to control the current in the initial stage, a resistor of 10 K$\Omega$ is connected in series to the power source circuit. A light source used in this step should emit light of 300,000 luxes of intensity of illumination within 50 mm$\phi$ of effective illumination area at a distance of 10 mm from the light source. A mercury lamp provides a suitable light source. The anodization is effected while the substrate is being illuminated by the light emitted from such a light source, with a diffusion glass disposed in front of the light source in order to uniformly illuminate the substrate.

The graph of FIG. 3 shows the changes in current and voltage relative to oxidation time, with the ordinates representing the current and voltage and the abscissa denoting the oxidation time.

The insulation film 5 formed by the above-described anodization method exhibits a resistivity as high as about $10^{14}$ Ω·cm. The insulation film 5 is advantageous in terms of a gate film over an oxide film formed by other methods such as thermal oxidation method and chemical vapor deposition method. To be more specific, the film 5 formed by anodizing method utilizing light irradiation is very uniform in component distribution. In addition, a degenerated layer owing to As decomposition, etc. is not formed at the boundary between the semi-insulating GaAs substrate and the insulation film 5.

FIGS. 4A and 4B show the component distributions of insulation films measured by Auger analysis, FIG. 4A covering a film formed by anodic oxidation utilizing light irradiation and FIG. 4B representing a film formed by a conventional method of thermal oxidation under a high temperature. In each of these graphs, the ordinate represents the peak-to-peak height and the abscissa denotes the sputtering time for gradually removing the formed insulation film. Incidentally, the sputtering time plotted is substantially proportional to the distance of the region from the surface of the insulation film formed.

FIG. 4B covering the case of thermal oxidation shows that the boundary region between the insulation film and the substrate was reached at a sputtering time of 1,200 to 1,300 minutes. An abnormal decrease of Ga and an abnormal increase of As are recognized near or at this boundary region, suggesting the formation of a degenerated layer. On the other hand, FIG. 4A covering the case of anodization shows that the boundary region mentioned was reached at a sputtering time of about 400 minutes. Unlike the thermal oxidation film, the anodization film is free from an abnormal decrease of Ga and an abnormal increase of As near or at the boundary region, demonstrating that a degenerated layer is not formed at the boundary region. It is also important to note that the substrate surface, when the anodization film is removed therefrom by etching, is as smooth as before the anodizing treatment and presents a mirror surface.

After forming the anodization film 5 at the exposed portion, an Al layer about 2,000 Å thick is formed by vapor deposition over the photo resist layer 4 and the insulation film 5, followed by removing completely the photo resist layer 4 formed on the n+ layer 2 using a photo resist removing agent. Suite naturally, that portion of the Al layer which is formed on the photo resist layer 4 is also removed together with the removed resist layer (lift off method), thereby providing a gate electrode 6 formed of the Al layer remaining on the insulation film 5 as shown in FIG. 1E.

Then, another photo resist layer is formed on the n+ layer 2 and partly removed to provide exposed portions of the n+ layer 2, followed by forming an In layer of about 2,000 Å thick by vapor deposition method to cover both the exposed portions and the remaining photo resist layer. When the In layer formed on the photo resist layer is removed by lift off method together with the photo resist layer, a source electrode 7 and a drain electrode 8 are formed on the n+ layer 2 in a manner to sandwich the gate electrode 6 as shown in FIG. 1F. Finally, sintering is carried out for 10 minutes in a furnace maintained at 200° C., thereby bringing the source electrode 7 and the drain electrode 8 into ohmic contact with the n+ layer 2.

In an MOS-FET produced by the method described, a semi-insulating GaAs substrate itself acts as an operating region or a gate region, resulting in that the floating capacitance between the gate and the substrate is markedly reduced and the withstand voltage is prominently enhanced, compared with a conventional MOS-FET using an n- or p-type GaAs substrate. The above-noted construction that a semi-insulating GaAs substrate acts as a gate region permits producing an additional merit. Namely, in a conventional MOS-FET, carriers are confined to a small region of inversion layer or channel, resulting in that the carriers are likely to be subjected to scattering at the boundary. In contrast, the particular construction mentioned enables the MOS-FET according to this invention to be free from the difficulty inherent in the conventional MOS-FET, leading to a high carrier mobility. For example, an MOS-FET according to this invention, in which electron constitutes the majority carrier, permits a carrier mobility at the channel region about twice as high as the value for a conventional MOS-FET using a p-channel type substrate having an impurity concentration of about $5 \times 10^{16}$ atoms $cm^{-3}$.

Insulated gate field effect transistors were actually produced by the described method of this invention and by a conventional method for the purpose of comparison. In the conventional method, used was a p-type substrate having an impurity concentration of about $5 \times 10^{16}$ atoms $cm^{-3}$. It was turned out that the power gain under 1 GHz was as large as 3 dB for the case of this invention in contrast to 0 dB for the conventional method. Likewise, the power gain under 500 MHz was more than 10 dB for this invention in contrast to about 5 dB for the conventional method.

FIGS. 2A to 2F show the steps of producing complementary MOS-FET's according to another embodiment of this invention. In the first step, a $p^{30}$ layer 11 is formed on a portion of one surface of a semi-insulating GaAs substrate 10 as shown in FIG. 2A by selective epitaxial growth method using a mask. Then, an $SiO_2$ film 12 is formed to cover both the p+ layer 11 and the exposed portion of the substrate 10 by chemical vapor deposition method as shown in FIG. 2B. The drawing also shows an ohmic electrode 13 of In-Sn alloy formed on the other surface of the substrate 10. The oxide film 12 thus formed is selectively removed by etching so as to provide openings through which an n-type impurity such as Te or Sn is diffused into the substrate 10 to form an n+ source region 14 and an n+ drain region 15 as shown in FIG. 2C. Alternately an ion implantation technique may be used to form said source and drain regions. A portion of the remaining $SiO_2$ film 12 is further etched away together with the p+ layer 11 just beneath the etched portion of the $SiO_2$ film 12 using a photo resist mask, thereby partly exposing the substrate 10 as shown in FIG. 2D. Still further, the remaining $SiO_2$ film 12 is entirely removed as shown in FIG. 2E.

Then, insulation films or gate oxide films 16 and 17 are formed as shown in FIG. 2F by anodic oxidation method using a photo resist mask (not shown) and light substantially equal to the one described previously. It is seen that the gate oxide film 16 is formed at that portion of the substrate 10 which was previously exposed by partly removing the p+ layer 11. On the other hand, the gate oxide film 17 is formed on the exposed surface of the substrate 10 between the source region 14 and the drain region 15. After forming the gate oxide films 16 and 17, an Al layer is formed by vapor deposition to cover the entire surface, followed by selectively removing the Al layer so to provide electrodes made of Al. Specifically, gate electrodes 22 and 23 are formed on the gate oxide films 16 and 17, respectively, and source electrodes 18 and 20, and drain electrodes 19 and 21 are formed on the p+ layers 11 in a manner to sandwich the gate oxide films 16 and 17.

The resultant complementary MOS-FET's are formed of a p-channel FET comprising the gate oxide film 16, the source electrode 18 and the drain electrode 19, and an n-channel FET comprising the gate oxide film 17, the source region 14 and the drain region 15. In each of these p- and n-channel FET's, the semi-insulating GaAs substrate 10 acts as an operating region. It follows that each of these FET's exhibits the effects equivalent to those exhibited by the FET shown in FIG. 1F. An additional merit inherent in the FET's of FIG. 2F is that it is unnecessary to separate electrically the two FET's by some particular means, leading to a simplified manufacturing process and rendering the FET's suitable for preparing an integrated circuit.

A semi-insulating GaAs substrate is used in each of the embodiments described, but it is possible to use another compound semiconductor such as GaP as the semi-insulating substrate. Further, the light source used in the anode oxidation step need not be restricted to a mercury lamp which is mentioned in the embodiment described first. Any kind of light such as laser beam can be used, provided the light energy is greater than the prohibition band width of the semiconductor material constituting the substrate.

It is also important to note that a known anodic oxidation method can be employed in this invention, though it is necessary to utilize light irradiation. For example, the electrolyte need not be restricted to a mixture of tartaric acid and propylene glycol mentioned in describing the first embodiment. It is possible to substitute citric acid for tartaric acid and ethylene glycol for propylene glycol. Or, an electrolyte containing hydrogen peroxide may be used in the anode oxidation step. In either case, a satisfactory oxide film can be formed on a semi-insulating compound semiconductor substrate.

What we claim is:

1. A method of producing a field effect transistor, comprising a first step of preparing a semi-insulating compound semiconductor substrate formed of GaAs containing $10^8$ to $10^{13}$ atoms·cm$^{-3}$ of an impurity, a second step of forming a high impurity concentration layer formed of GaAs of one conductivity type on one surface of the substrate, a third step of partly removing the high impurity concentration layer to divide said layer into two portions and expose partly the substrate surface, and a fourth step of forming a gate insulation film by subjecting the exposed portion of the substrate to anodization which is carried out while light having an energy greater than the prohibition band width of the compound semiconductor is being irradiated to the exposed portion.

2. The method according to claim 1, wherein the third step comprises a step of forming a mask having an opening on the high impurity concentration layer and a step of selectively removing the high impurity concentration layer by etching utilizing said mask.

3. The method according to claim 2, wherein the surface region of the substrate is slightly etched away to form a recess on the surface of the substrate in the etching step for selectively removing the high impurity concentration layer.

4. The method according to claim 1, which further comprises a fifth step of forming a gate electrode on the gate oxide film, a source electrode on one portion of the divided high impurity concentration layer and a drain electrode on the other portion of the divided high impurity concentration layer.

5. The method according to claim 4, wherein the fifth step comprises forming a mask having openings, said mask covering both of the divided portions of the high impurity concentration layer, forming a metal layer by vapor deposition extending to cover the mask and that portions of the high impurity concentration layer which have been exposed by the openings of the mask, and peeling off the mask together with the metal layer formed thereon.

6. A method of producing a field effect transistor, comprising a first step of preparing a semi-insulating compound semiconductor substrate formed of GaAs containing $10^8$ to $10^{13}$ atoms·cm$^{-3}$ of an impurity, a second step of forming a mask having two openings apart from each other on the substrate, a third step of diffusing an impurity into the substrate through the openings of the mask so as to form source and drain regions of one conductivity type in the substrate, a fourth step of removing the mask between the source and drain regions so as to expose the corresponding portion of the substrate, and a fifth step of forming a gate insulation film by anodic oxidation of the exposed portion of the substrate, said anodic oxidation being carried out while light having an energy greater than the prohibition band width of the compound semiconductor is being irradiated to the exposed portion of the substrate.

* * * * *